United States Patent
Oguro et al.

(10) Patent No.: US 11,961,754 B2
(45) Date of Patent: Apr. 16, 2024

(54) SUBSTRATE FIXING DEVICE

(71) Applicant: SHINKO ELECTRIC INDUSTRIES CO., LTD., Nagano (JP)

(72) Inventors: Hiroki Oguro, Nagano (JP); Yusuke Kinoshita, Nagano (JP); Yuichi Nakamura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 293 days.

(21) Appl. No.: 17/453,521

(22) Filed: Nov. 4, 2021

(65) Prior Publication Data

US 2023/0060253 A1 Mar. 2, 2023

(30) Foreign Application Priority Data

Aug. 25, 2021 (JP) ................. 2021-137197

(51) Int. Cl.
 *H01T 23/00* (2006.01)
 *H01L 21/28* (2006.01)
 *H01L 21/683* (2006.01)

(52) U.S. Cl.
 CPC .... *H01L 21/6833* (2013.01); *H01L 21/28026* (2013.01); *H01L 21/28158* (2013.01)

(58) Field of Classification Search
 None
 See application file for complete search history.

(56) References Cited

U.S. PATENT DOCUMENTS

| | | | |
|---|---|---|---|
| 5,539,179 A | 7/1996 | Nozawa et al. | |
| 6,151,203 A | 11/2000 | Shamouilian et al. | |
| 7,068,489 B2 * | 6/2006 | Migita | H01L 21/6831 361/230 |
| 7,576,967 B2 | 8/2009 | Morioka et al. | |
| 8,469,342 B2 * | 6/2013 | Tatsumi | H01L 21/6833 269/21 |
| 8,542,474 B2 | 9/2013 | Yonekura et al. | |
| 9,240,340 B2 * | 1/2016 | Shiraiwa | H01L 21/6833 |
| 10,147,628 B2 | 12/2018 | Shiraiwa et al. | |

FOREIGN PATENT DOCUMENTS

| | | |
|---|---|---|
| JP | 2006-344613 | 12/2006 |
| JP | 2007-258615 | 10/2007 |
| JP | 2015-225952 | 12/2015 |
| WO | 2006/073947 | 7/2006 |

* cited by examiner

Primary Examiner — Stephen W Jackson
(74) Attorney, Agent, or Firm — IPUSA, PLLC

(57) ABSTRACT

A substrate fixing device includes a baseplate, an electrostatic attraction member, and an electrode pin. The baseplate includes a metallic member in which a through hole is famed. The electrostatic attraction member is over a surface of the baseplate and includes an attraction electrode. The electrode pin is inserted through the through hole to be connected to the attraction electrode. A recess communicating with the through hole is formed in the surface of the metallic member with the through hole being within the recess in a plan view from a direction perpendicular to the surface of the metallic member.

12 Claims, 8 Drawing Sheets

SUBSTRATE FIXING DEVICE

CROSS-REFERENCE TO RELATED APPLICATION

This application is based upon and claims priority to Japanese Patent Application No. 2021-137197, filed on Aug. 25, 2021, the entire contents of which are incorporated herein by reference.

FIELD

A certain aspect of the embodiments discussed herein is related to substrate fixing devices.

BACKGROUND

As a substrate fixing device used for fixing a substrate such as a wafer, a substrate fixing device in which an opening for an electrode pin and a recess near the baseplate side end of the opening are famed in an electrostatic attraction member including an attraction electrode is known. Because the recess is formed, the distance between the connection of the electrode pin and the attraction electrode and the baseplate increases to suppress discharge between the connection and the baseplate (see Japanese Laid-open Patent Publication Nos. 2015-225952 and 2007-258615).

SUMMARY

According to an embodiment, a substrate fixing device includes a baseplate, an electrostatic attraction member, and an electrode pin. The baseplate includes a metallic member in which a through hole is formed. The electrostatic attraction member is over a surface of the baseplate and includes an attraction electrode. The electrode pin is inserted through the through hole to be connected to the attraction electrode. A recess communicating with the through hole is formed in the surface of the metallic member with the through hole being within the recess in a plan view from a direction perpendicular to the surface of the metallic member.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
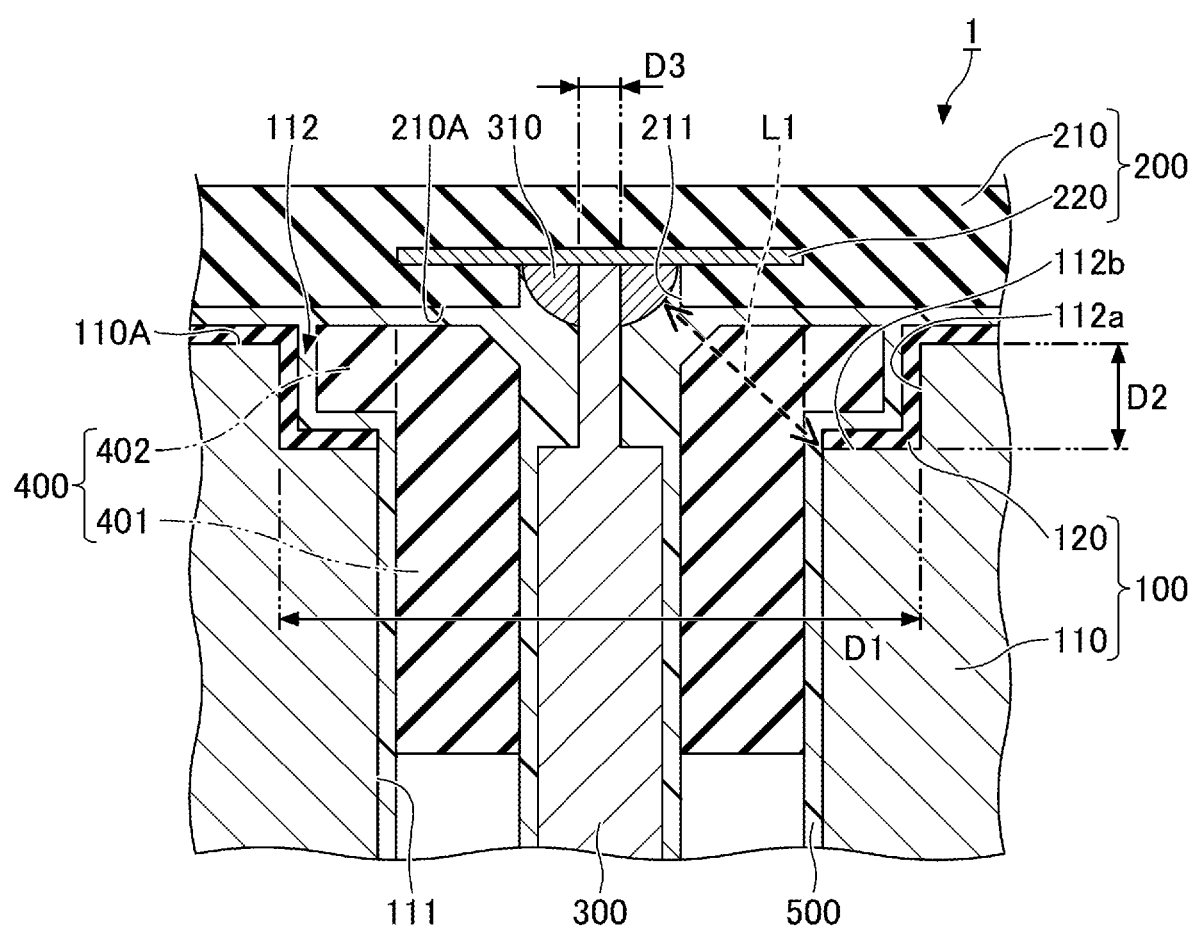
FIG. 1 is a sectional view of a substrate fixing device according to a first embodiment.

According to the background-art substrate fixing device, when the electrostatic attraction member is thin, a recess having a sufficient depth cannot be formed, so that discharge is less likely to be suppressed.

Thus, it is desired that a substrate fixing device can suppress discharge even with a thin electrostatic attraction member.

According to an embodiment, it is possible to suppress discharge even with a thin electrostatic attraction member.

Embodiments of the present invention are explained with reference to the accompanying drawings. In the specification and drawings, components having substantially the same functional configuration are referred to using the same reference numeral, and a duplicate description thereof may be omitted.

First Embodiment

First, a first embodiment is described. The first embodiment relates to a substrate fixing device.

FIG. 1 is a sectional view of a substrate fixing device according to the first embodiment. Referring to FIG. 1, a substrate fixing device 1 according to the first embodiment includes a baseplate 100, an electrostatic attraction member 200, an electrode pin 300, an insulation sleeve 400, and an adhesive layer 500.

The baseplate 100 includes a plate-shaped metallic member 110 and an insulating film 120.

The thickness of the metallic member 110 is, for example, approximately 20 mm to approximately 50 mm. The metallic member 110 is formed of, for example, aluminum, an aluminum alloy, titanium, or a titanium alloy. A through hole 111 that penetrates through the metallic member 110 in its thickness direction is famed in the metallic member 110. The shape of the through hole 111 is, for example, substantially circular (cylindrical). The diameter of the through hole 111 is approximately 5 mm to approximately 6 mm. The electrode pin 300 is inserted through the through hole 111. The metallic member 110 includes a first surface 110A. The electrostatic attraction member 200 is provided over the first surface 110A. A counterbore-like recess 112 that enlarges the through hole 111, that is, includes the through hole 111 in a plan view from a direction perpendicular to the first surface 110A of the metallic member 110 (hereinafter "plan view"), is famed in the first surface 110A. The recess 112 communicates with the through hole 111. The shape of the recess 112 is, for example, substantially circular. A diameter D1 of the recess 112 is approximately 8 mm to approximately 12 mm. A depth D2 of the recess 112 is approximately 1.5 mm to approximately 2.5 mm. The central axis of the through hole 111 substantially coincides with the central axis of the recess 112.

The metallic member 110 may also be used as an electrode for controlling a plasma, or the like. By feeding the metallic member 110 with predetermined high-frequency electric power, it is possible to control energy for colliding generated ions or the like in a plasma state with a substrate such as a wafer attracted and held onto the electrostatic attraction member 200 and effectively perform etching.

The insulating film 120 is formed on the first surface 110A, a surface of the metallic member 110 defining the side of the recess 112 (hereinafter "sidewall surface 112a of the recess 112"), and a surface of the metallic member 110 defining the bottom of the recess 112 (hereinafter "bottom surface 112b of the recess 112"). The insulating film 120 is, for example, an aluminum oxide film. The thickness of the insulating film 120 is approximately 0.2 mm to approximately 0.4 mm. For example, when the metallic member 110 is formed of aluminum or an aluminum alloy, the insulating film 120 may be formed by anodizing the metallic member 110 or performing thermal spraying of aluminum oxide on the metallic member 110.

The electrostatic attraction member 200 includes a plate-shaped ceramic member (substrate) 210 and an attraction electrode 220. The attraction electrode 220 is buried in the ceramic member 210. The ceramic member 210 includes a second surface 210A that faces the first surface 110A of the metallic member 110. The second surface 210A is substantially a flat surface. An opening 211 that reaches (exposes) the attraction electrode 220 is formed in the second surface 210A of the ceramic member 210. In the plan view, the opening 211 is positioned within the through hole 111, and the attraction electrode 220 lies over the through hole 111. The electrostatic attraction member 200 may further include a heater.

The electrode pin 300 has a substantially cylindrical shape, and is inserted into the through hole 111 to be bonded to the attraction electrode 220 by a bonding material 310 within the opening 211. A diameter D3 of a part of the electrode pin 300 that contacts the attraction electrode 220 is approximately 1.3 mm to approximately 1.7 mm. The bonding material 310 is, for example, a solder material or a brazing material. That is, the electrode pin 300 is, for example, soldered or brazed to the attraction electrode 220. The magnitude of the voltage applied from the electrode pin 300 to the attraction electrode 220 is, for example, approximately 3000 V to approximately 6000 V.

The insulation sleeve 400 includes a tubular base 401 and a flange 402. The base 401 is placed within the through hole 111, and the electrode pin 300 is inserted through the inside of the base 401. The base 401 covers the side surface of the electrode pin 300. The thickness of the base 401 is approximately equal to the distance between the exterior surface of the electrode pin 300 and the inner wall surface of the metallic member 110 defining the through hole 111 (hereinafter "inner wall surface of the through hole 111"). The flange 402 is a part of the insulation sleeve 400 that protrudes radially outward from the base 401 at its end toward the electrostatic attraction member 200. The flange 402 is positioned between the bottom surface 112b of the recess 112 and the second surface 210A of the electrostatic attraction member 200 to be held between the bottom of the recess 112 and the electrostatic attraction member 200. The material of the insulation sleeve 400 is an organic insulator such as polyimide or an inorganic insulator such as alumina. The insulation sleeve 400 is an example of a first tubular insulation component. The base 401 is an example of a first base.

The adhesive layer 500 bonds the electrostatic attraction member 200 (the ceramic member 210) to the insulating film 120 and the insulation sleeve 400, bonds the insulating film 120 and the metallic member 110 to the insulation sleeve 400, and bonds the insulation sleeve 400 and the electrode pin 300 together. The base 401 of the insulation sleeve 400 is bonded to the metallic member 110 by the adhesive layer 500. The material of the adhesive layer 500 is, for example, an insulating resin such as silicone resin. The adhesive layer 500 may contain filler such as alumina or aluminum nitride.

Next, a method of manufacturing the substrate fixing device 1 is described. FIGS. 2A through 2F are sectional views illustrating a method of manufacturing the substrate fixing device 1 according to the first embodiment.

Figure 2A:
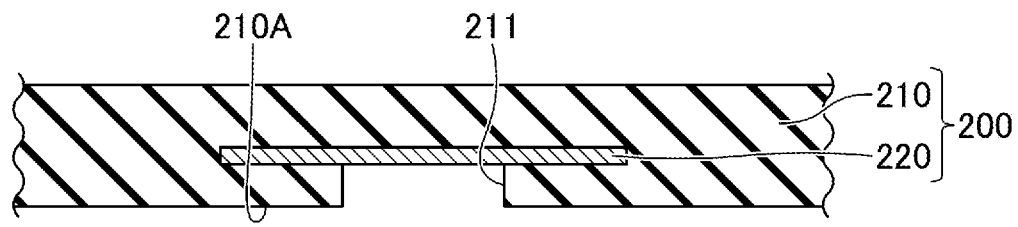
FIGS. 2A through 2F are sectional views illustrating a method of manufacturing a substrate fixing device according to the first embodiment.

First, as illustrated in FIG. 2A, the electrostatic attraction member 200 including the ceramic member 210 and the attraction electrode 220, where the opening 211 is formed in the ceramic member 210, is prepared.

Figure 2B:
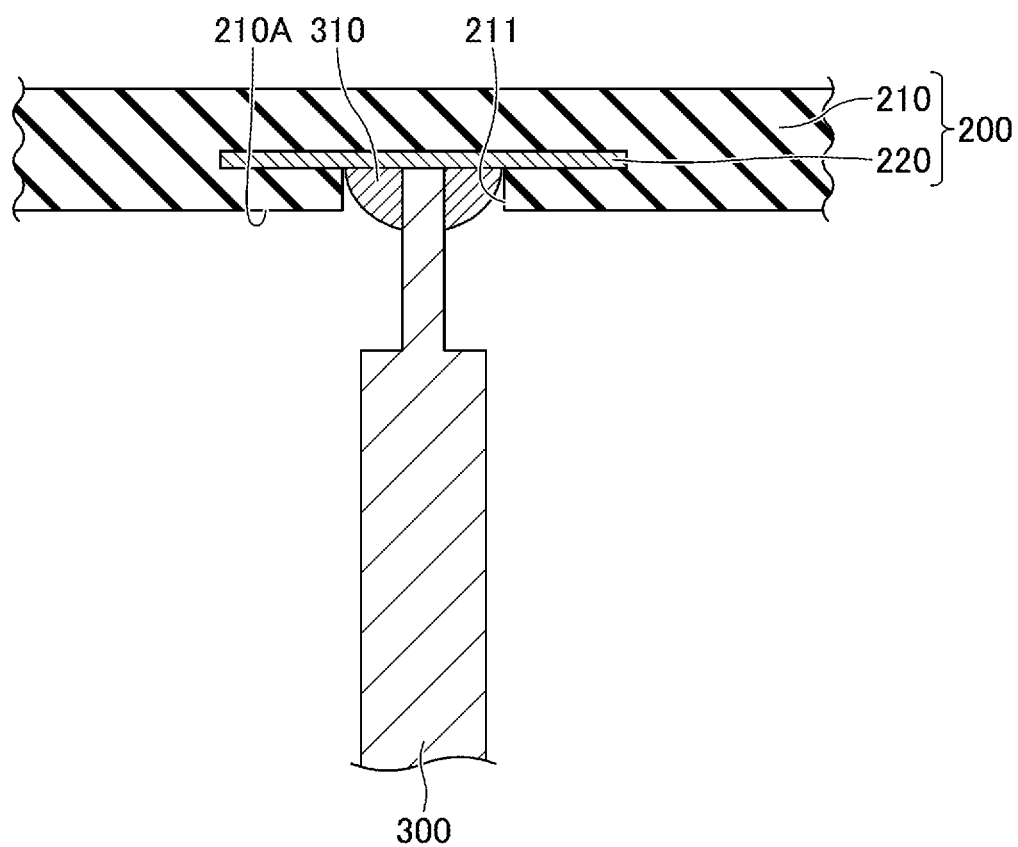

Next, as illustrated in FIG. 2B, the electrode pin 300 is bonded to the attraction electrode 220 within the opening 211 by soldering or brazing.

Figure 2C:
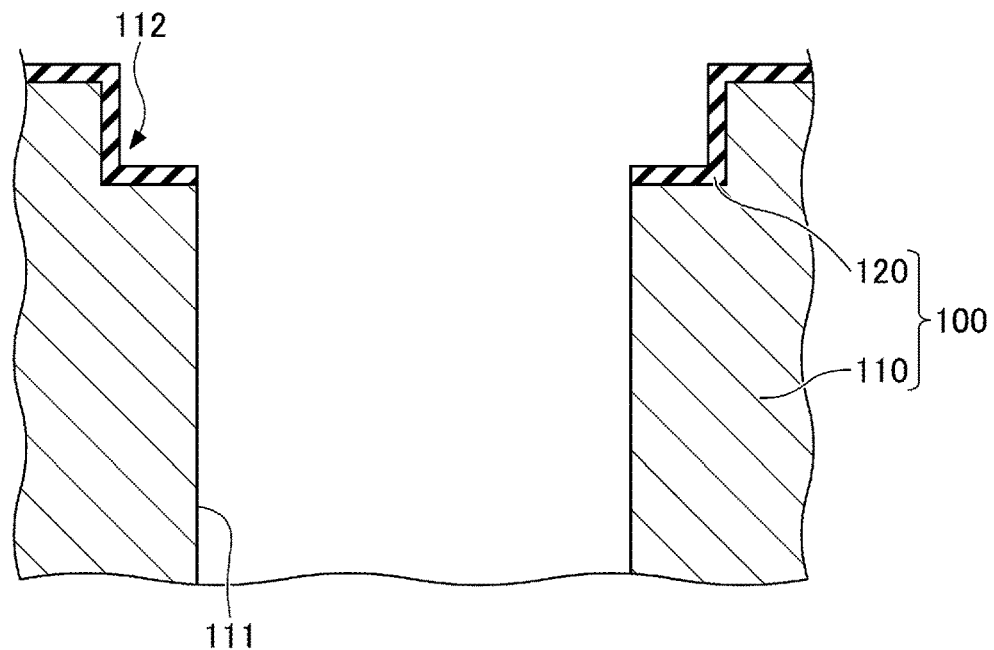

Furthermore, as illustrated in FIG. 2C, the baseplate 100 including the metallic member 110 in which the through hole 111 and the recess 112 are formed and the insulating film 120 is prepared. For example, when the metallic member 110 is formed of aluminum or an aluminum alloy, the insulating film 120 may be formed by anodizing the metallic member 110 or performing thermal spraying of aluminum oxide on the metallic member 110.

Figure 2D:
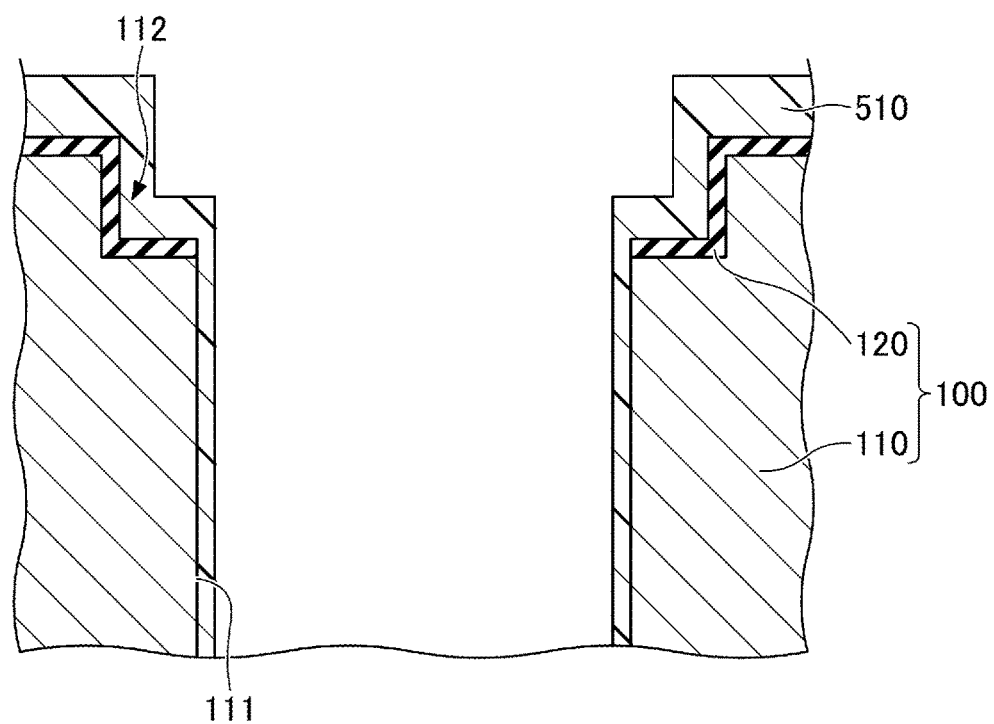

Next, as illustrated in FIG. 2D, an adhesive 510 having fluidity is provided, for example, applied, on a surface of the insulating film 120 and a surface of the metallic member 110.

Figure 2E:
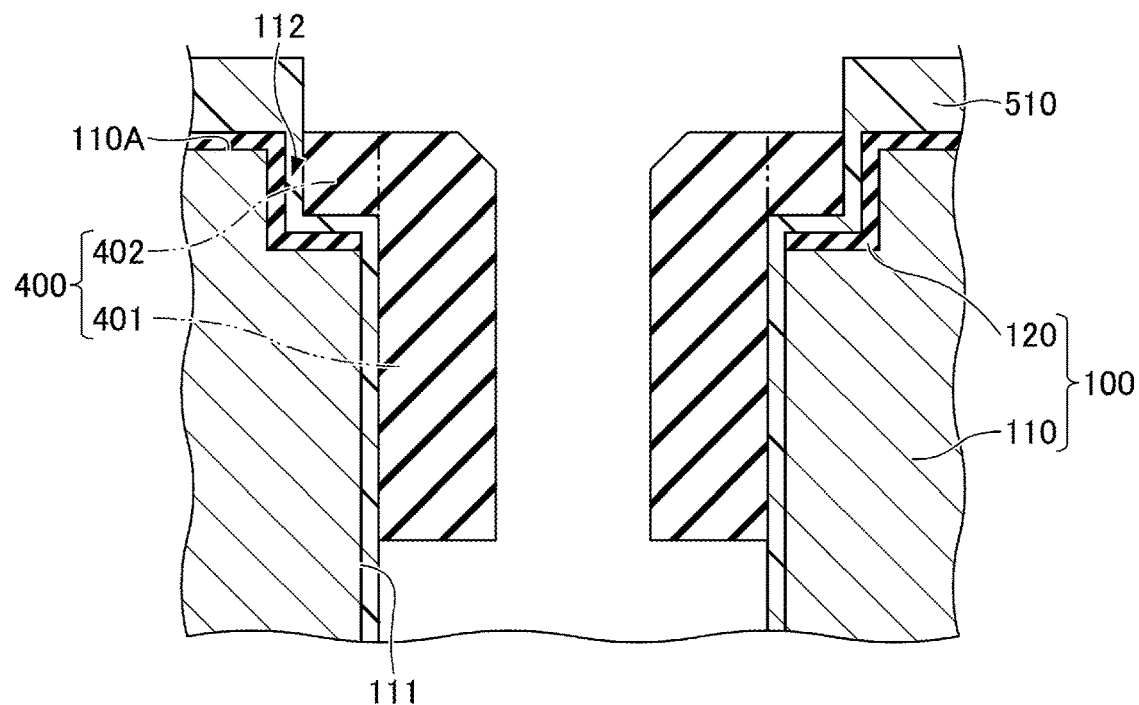

Next, as illustrated in FIG. 2E, the insulation sleeve 400 is inserted into the recess 112 and the through hole 111 from the first surface 110A side of the metallic member 110 such that the flange 402 catches on the bottom of the recess 112. As a result, part of the adhesive 510 provided in the recess 112 moves above the first surface 110A. Furthermore, the base 401 contacts the adhesive 510 on the inner wall surface of the through hole 111.

Figure 2F:
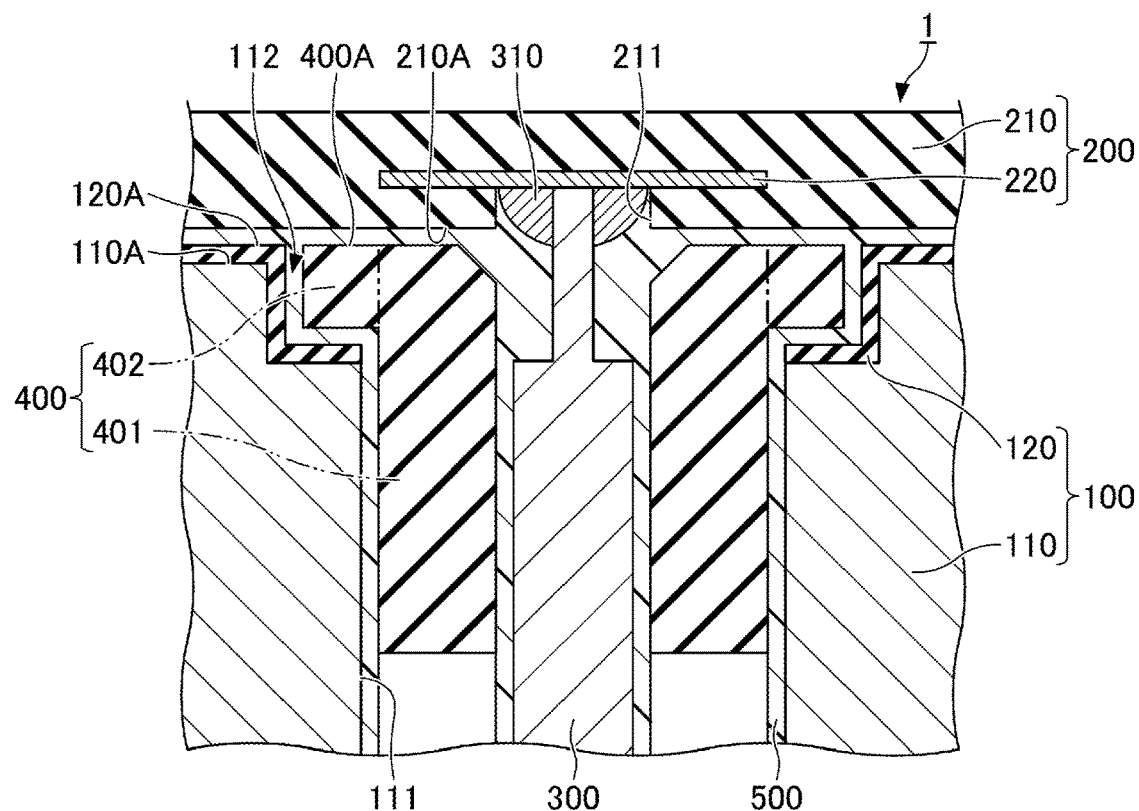

Next, as illustrated in FIG. 2F, the second surface 210A of the ceramic member 210 is caused to contact the adhesive 510 while inserting the electrode pin 300 into the inside of the insulation sleeve 400 from the first surface 110A side of the metallic member 110. Then, the electrostatic attraction member 200 is pressed against and bonded to the baseplate 100. As a result, the adhesive 510 between the baseplate 100 and the electrostatic attraction member 200 spreads through a gap on and around the ceramic member 210, the insulation sleeve 400, and the electrode pin 300. Next, by curing the adhesive 510, the adhesive layer 500 is famed from the adhesive 510. A surface 120A of the insulating film 120 on the first surface 110A facing the electrostatic attraction member 200 (the ceramic member 210) may be substantially flush with a surface 400A of the insulation sleeve 400 facing the electrostatic attraction member 200 (the ceramic member 210).

In this manner, the substrate fixing device 1 according to the first embodiment may be manufactured.

Figure 3:
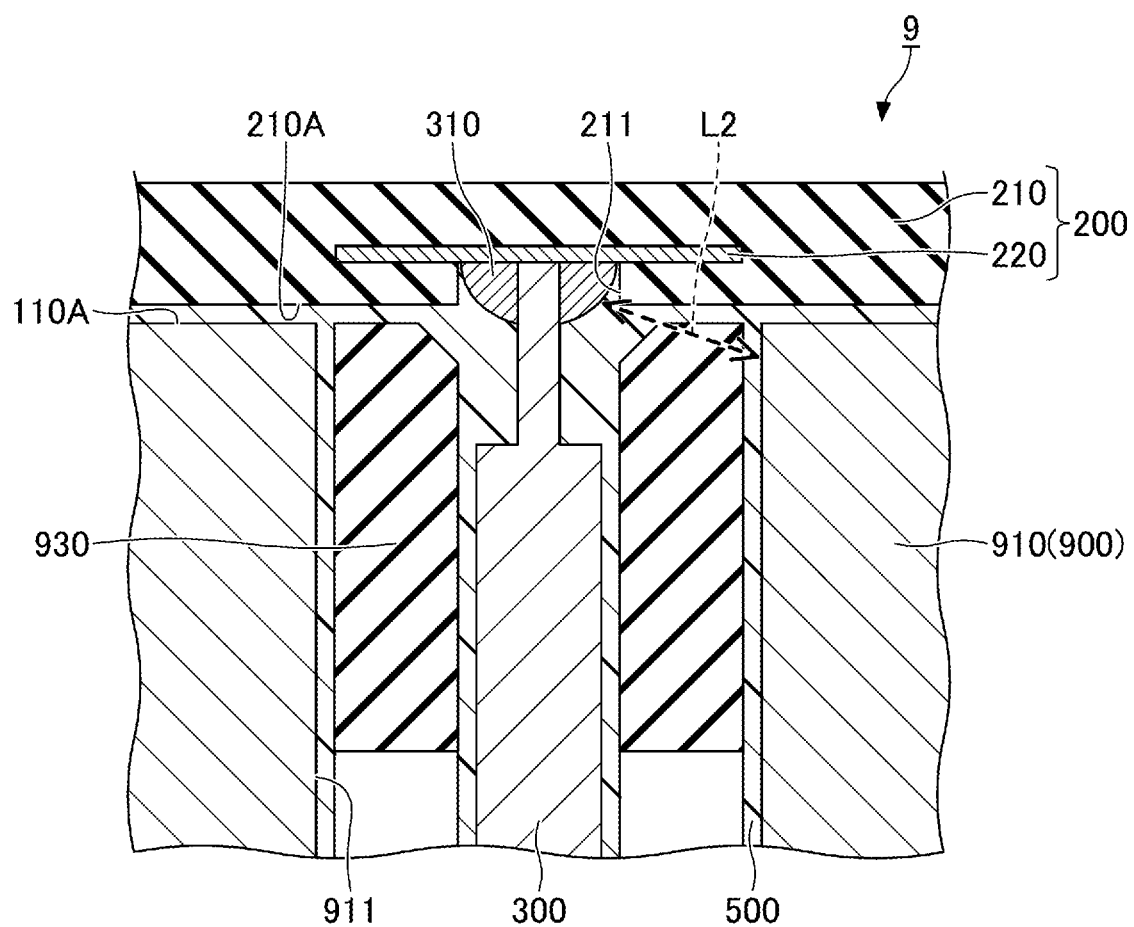
FIG. 3 is a sectional view of a substrate fixing device according to a reference example.

Here, effects according to the first embodiment are described while making a comparison with a reference example. FIG. 3 is a sectional view of a substrate fixing device according to the reference example.

A substrate fixing device 9 according to the reference example differs from the substrate fixing device 1 of the first embodiment basically in baseplate structure. Referring to FIG. 3, the baseplate 100 of the first embodiment is replaced with a baseplate 900. The baseplate 900 includes a metallic member 910 formed of the same material as the metallic member 110. While a through hole 911 that is the same as the through hole 111 is formed, no recess is formed in the metallic member 910. Furthermore, the insulating film 120 is not formed on the metallic member 910. In addition, the insulation sleeve 400 of the first embodiment is replaced with a cylindrical insulation sleeve 930. Otherwise, the substrate fixing device 9 has the same configuration as the substrate fixing device 1 of the first embodiment.

Comparing the first embodiment with the reference example, the recess 112 is famed in the metallic member 110 of the baseplate 100, and therefore, a shortest distance L1 between the bonding material 310 and the baseplate 100 is greater than a shortest distance L2 between the bonding material 310 and the baseplate 900. Here, the shortest distances L1 and L2 are distances in a path that excludes the ceramic member 210, which is likely to prevent discharge. For example, the shortest distance L2 is approximately 2 mm, while the shortest distance L1 is approximately 5 mm to approximately 6 mm. Therefore, according to the first embodiment, discharge can be less likely to occur in light of the shape of the metallic member 110.

Furthermore, according to the first embodiment, the baseplate 100 includes the insulating film 120. Therefore, according to the first embodiment, discharge can be less likely to occur in light of insulation as well.

Thus, according to the first embodiment, it is possible to suppress discharge irrespective of the thickness of the electrostatic attraction member 200. Furthermore, because discharge is suppressed, it is possible to extend the service life of the substrate fixing device 1.

Second Embodiment

Next, a second embodiment is described. The second embodiment differs from the first embodiment basically in insulation sleeve configuration.

Figure 4:
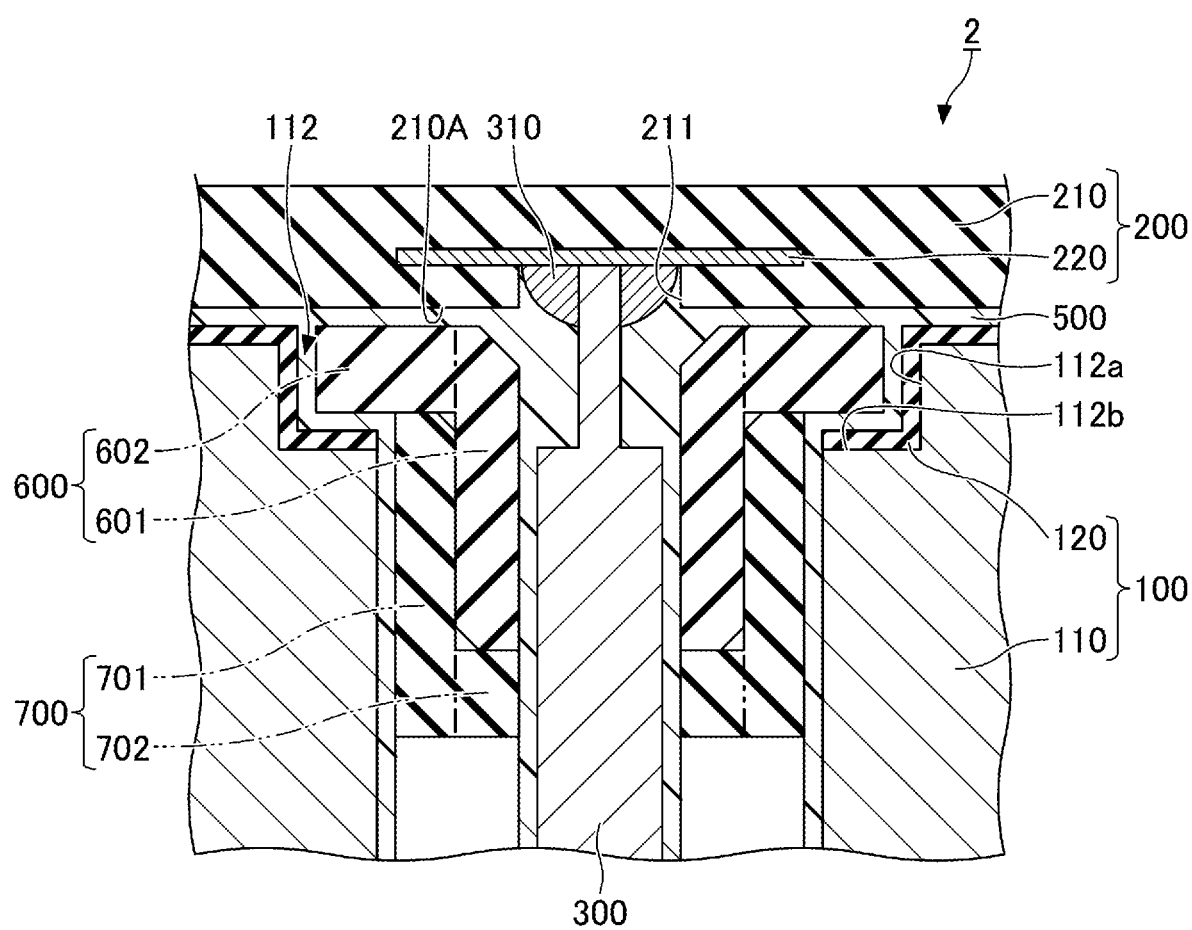
FIG. 4 is a sectional view of a substrate fixing device according to a second embodiment.

FIG. 4 is a sectional view illustrating a substrate fixing device according to the second embodiment. As illustrated in FIG. 4, a substrate fixing device 2 according to the second embodiment includes insulation sleeves 600 and 700 in place of the insulation sleeve 400 of the first embodiment.

The insulation sleeve 600 includes a tubular base 601 and a flange 602. The base 601 is placed within the through hole 111, and the electrode pin 300 is inserted through the inside of the base 601. The base 601 covers the side surface of the electrode pin 300. The thickness of the base 601 is approximately half the distance between the exterior surface of the electrode pin 300 and the inner wall surface of the through hole 111. The flange 602 is a part of the insulation sleeve 600 that protrudes radially outward from the base 601 at its end toward the electrostatic attraction member 200. Like the flange 402, the flange 602 is positioned between the bottom surface 112b of the recess 112 and the second surface 210A of the electrostatic attraction member 200 to be held between the bottom of the recess 112 and the electrostatic attraction member 200. The material of the insulation sleeve 600 is an organic insulator such as polyimide or an inorganic insulator such as alumina. The insulation sleeve 600 is an example of the first tubular insulation component. The base 601 is an example of the first base.

The insulation sleeve 700 includes a tubular base 701 and an inward protrusion 702. The base 701 is placed outside the base 601 within the through hole 111. That is, the base 701 is provided between the base 601 and the metallic member 110 in the radial direction of the through hole 111. The base 601 and the base 701 contact each other. The base 701 also contacts the flange 602. The thickness of the base 701 is approximately half the distance between the exterior surface of the electrode pin 300 and the inner wall surface of the through hole 111. The inward protrusion 702 is a part of the insulation sleeve 700 that protrudes radially inward from the base 701 at its end facing away from the electrostatic attraction member 200. The inward protrusion 702 contacts the base 601 of the insulation sleeve 600 at its end facing away from the electrostatic attraction member 200. The material of the insulation sleeve 700 is an organic insulator such as polyimide or an inorganic insulator such as alumina. The insulation sleeve 700 is an example of a second tubular insulation component. The base 701 is an example of a second base.

Otherwise, the second embodiment may be equal in configuration to the first embodiment.

Next, a method of manufacturing the substrate fixing device 2 is described. FIGS. 5A through 5D are sectional views illustrating a method of manufacturing the substrate fixing device 2 according to the second embodiment.

First, the same as in the first embodiment, the electrostatic attraction member 200 is prepared, and the electrode pin 300 is bonded to the attraction electrode 220 within the opening 211 by soldering or brazing (see FIG. 2B).

Figure 5A:
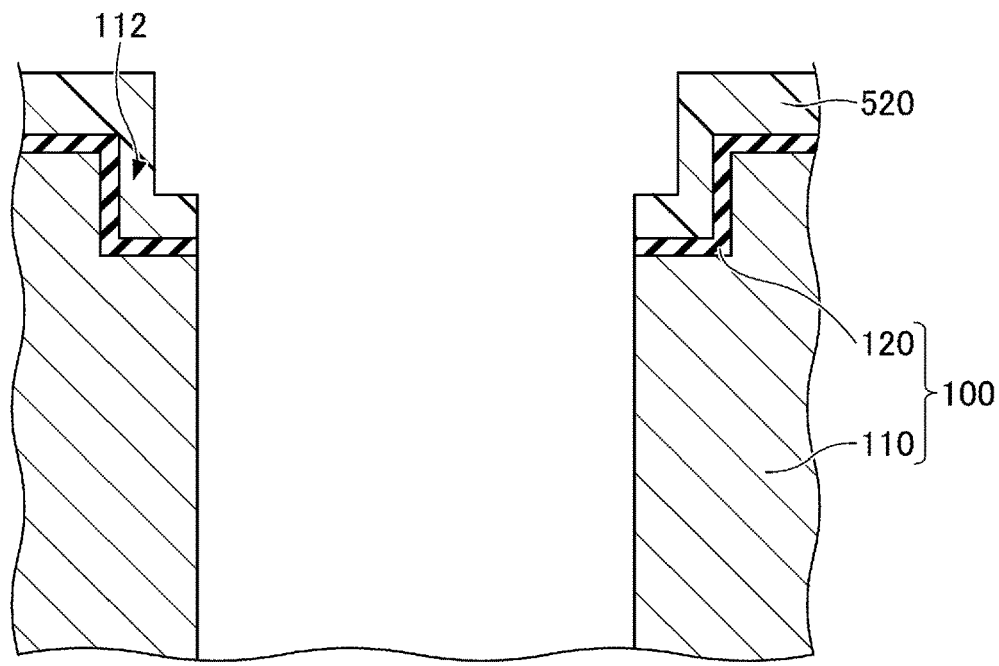
FIGS. 5A through 5D are sectional views illustrating a method of manufacturing a substrate fixing device according to the second embodiment.

Furthermore, the same as in the first embodiment, the baseplate 100 is prepared (see FIG. 2C). Next, as illustrated in FIG. 5A, an adhesive 520 having fluidity is provided, for example, applied, on a surface of the insulating film 120.

Figure 5B:
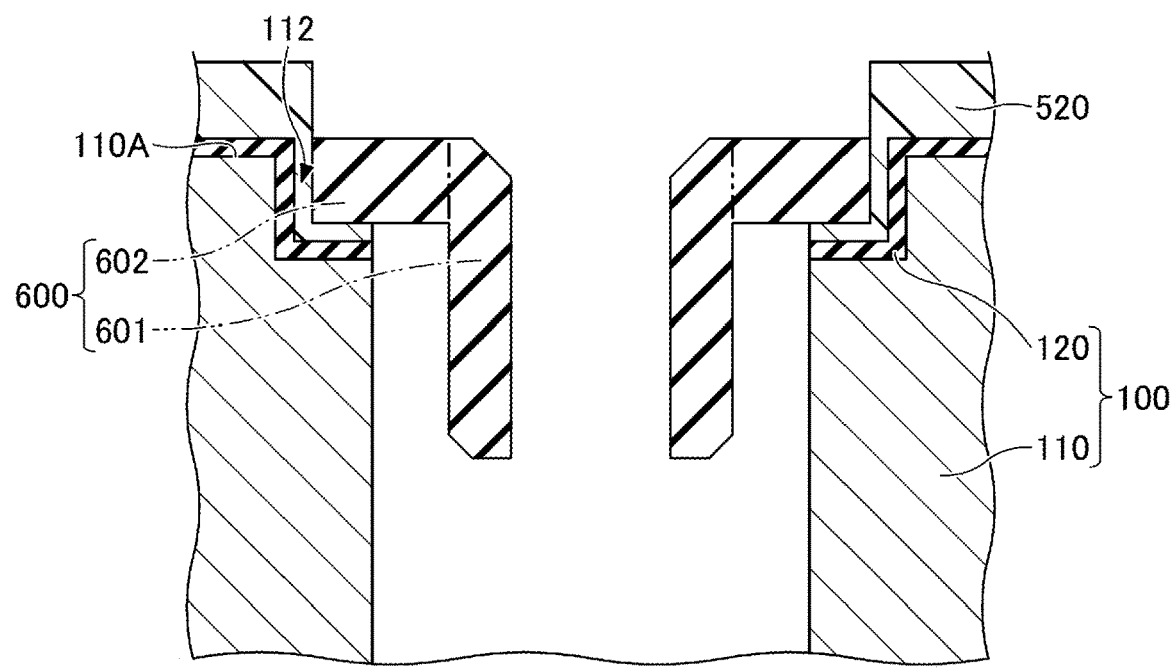

Next, as illustrated in FIG. 5B, the insulation sleeve 600 is inserted into the recess 112 and the through hole 111 from the first surface 110A side of the metallic member 110 such that the flange 602 catches on the bottom of the recess 112. As a result, part of the adhesive 520 provided in the recess 112 moves above the first surface 110A. Furthermore, there is a gap between the inner wall surface of the through hole 111 and the base 601.

Figure 5C:
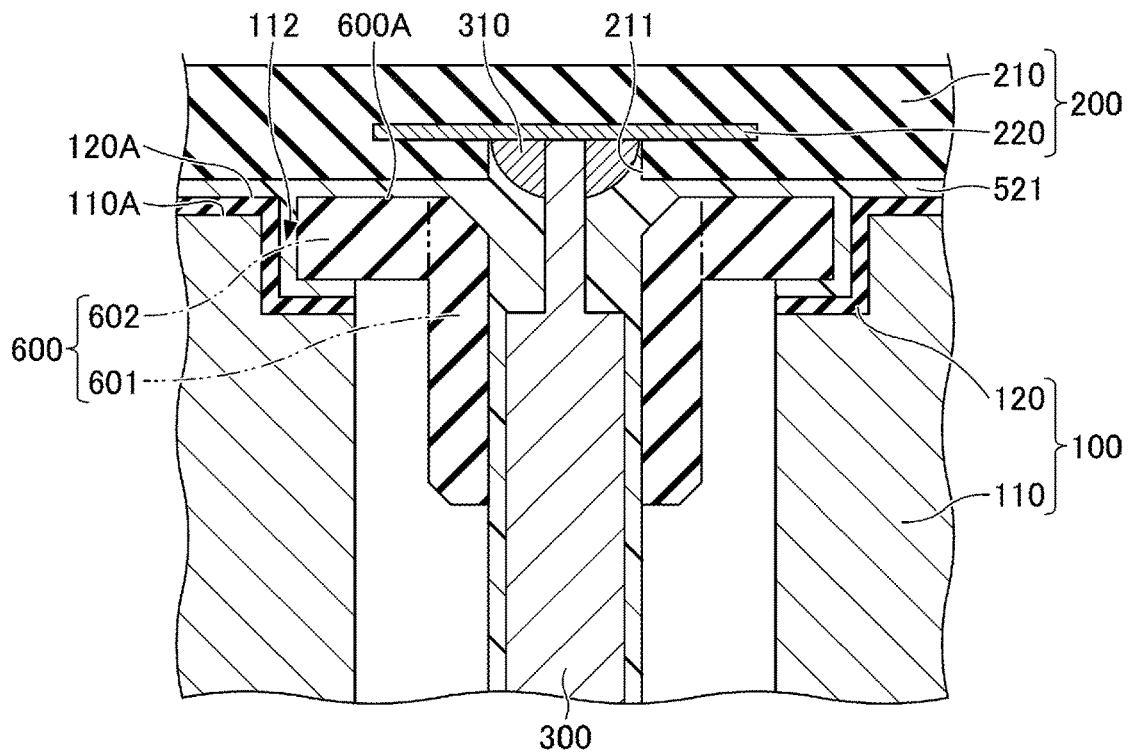

Next, as illustrated in FIG. 5C, the second surface 210A of the ceramic member 210 is caused to contact the adhesive 520 while inserting the electrode pin 300 into the inside of the insulation sleeve 600 from the first surface 110A side of the metallic member 110. Then, the electrostatic attraction member 200 is pressed against and bonded to the baseplate 100. As a result, the adhesive 520 between the baseplate 100 and the electrostatic attraction member 200 spreads through a gap on and around the ceramic member 210, the insulation sleeve 600, and the electrode pin 300. Next, by curing the adhesive 520, an adhesive layer 521 is famed from the adhesive 520. The surface 120A of the insulating film 120 on the first surface 110A may be substantially flush with a surface 600A of the insulation sleeve 600 facing the electrostatic attraction member 200 (the ceramic member 210).

Figure 5D:
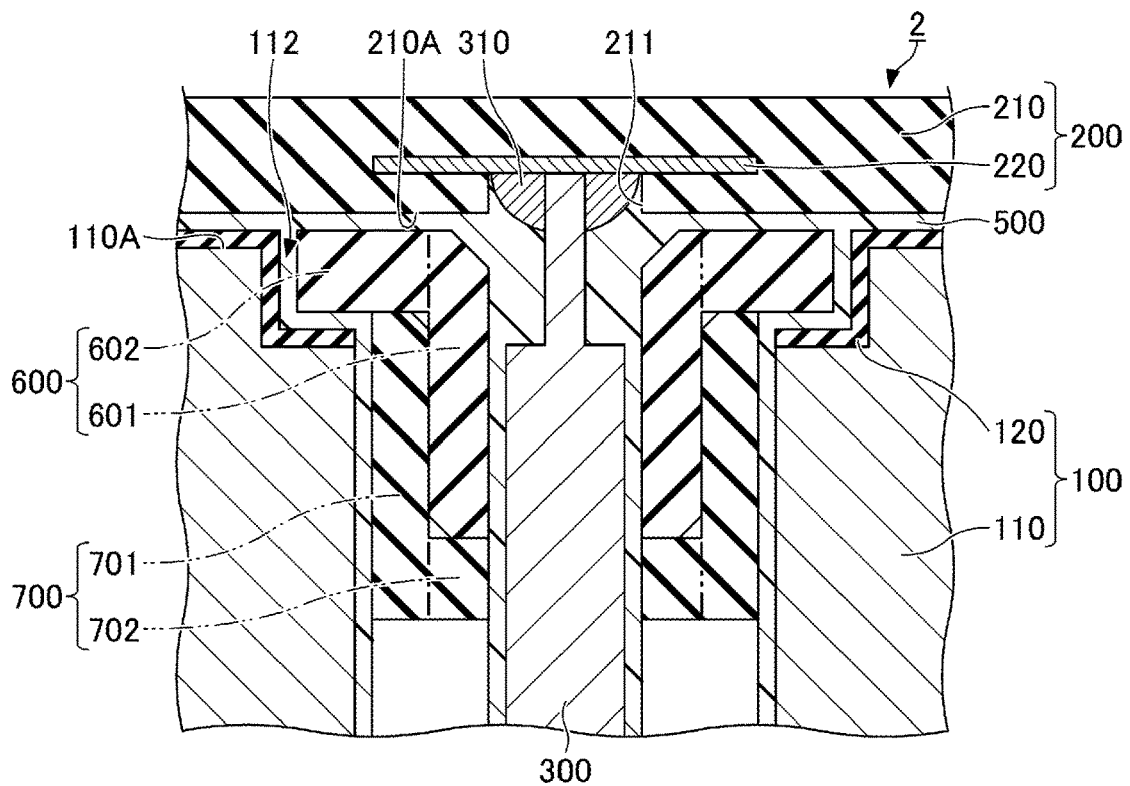

Next, as illustrated in FIG. 5D, the insulation sleeve 700 is inserted into the through hole 111 from the side of the metallic member 110 opposite from the first surface 110A side such that the end of the base 701 opposite from the end at which the inward protrusion 702 is provided contacts the flange 602. The inward protrusion 702 may contact the base 601. At this point, an adhesive having fluidity is provided on the exterior side surface of the insulation sleeve 700. After the insertion, by curing the adhesive provided on the insulation sleeve 700, the adhesive layer 500 including the adhesive layer 521 is formed.

According to the second embodiment as well, the same effects as in the first embodiment can be produced. Furthermore, according to the second embodiment, the insulation sleeve 700 may be placed after the baseplate 100 and the electrostatic attraction member 200 are bonded together.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention are described in detail, it should be understood that various changes, substitutions, and alterations could be made hereto without departing from the spirit and scope of the invention.

What is claimed is:

1. A substrate fixing device comprising:
   a baseplate including a metallic member in which a through hole is formed;

an electrostatic attraction member over a surface of the metallic member, the electrostatic attraction member including an attraction electrode; and an electrode pin inserted through the through hole to be connected to the attraction electrode, wherein a recess communicating with the through hole is formed in the surface of the metallic member with the through hole being within the recess in a plan view from a direction perpendicular to the surface of the metallic member.

2. The substrate fixing device as claimed in claim 1, wherein a diameter of the recess is 8 mm to 12 mm, and a depth of the recess is 1.5 mm to 2.5 mm.

3. The substrate fixing device as claimed in claim 1, wherein the baseplate further includes an insulating film covering a sidewall surface and a bottom surface of the recess.

4. The substrate fixing device as claimed in claim 3, wherein a thickness of the insulating film is 0.2 mm to 0.4 mm.

5. The substrate fixing device as claimed in claim 1, further comprising:

a tubular insulation component within the through hole, the tubular insulation component including a tubular base through which the electrode pin is inserted; and a flange protruding radially outward from the tubular base and held between a bottom of the recess and the electrostatic attraction member.

6. The substrate fixing device as claimed in claim 5, wherein the tubular base is bonded to the electrode pin.

7. The substrate fixing device as claimed in claim 5, wherein the tubular base is bonded to the metallic member.

8. The substrate fixing device as claimed in claim 5, further comprising:

an additional tubular insulation component including a base placed between the tubular base and the metallic member.

9. The substrate fixing device as claimed in claim 8, wherein the base is bonded to the metallic member.

10. A substrate fixing device comprising:

a baseplate including a metallic member in which a through hole is formed;

a ceramic substrate over a surface of the metallic member, the ceramic substrate including an attraction electrode; and an electrode pin inserted through the through hole to be connected to the attraction electrode, wherein a recess enlarging the through hole open at a bottom of the recess is formed in the suffice of the metallic member, and a surface of the ceramic substrate facing the surface of the metallic member and facing toward the bottom of the recess is a flat surface.

11. The substrate fixing device as claimed in claim 10, further comprising:

a tubular insulation component within the through hole; and an adhesive layer bonding the ceramic substrate to the metallic member and the tubular insulation component.

12. The substrate fixing device as claimed in claim 11, wherein the baseplate further includes an insulating film covering the surface of the metallic member, and a surface of the insulating film facing the ceramic substrate is flush with a surface of the tubular insulation component facing the ceramic substrate.

* * * * *